United States Patent [19]

Kajigaya

[11] Patent Number: 5,029,330
[45] Date of Patent: Jul. 2, 1991

[54] SEMICONDUCTOR MEMORY DEVICE

[75] Inventor: Kazuhiko Kajigaya, Iruma, Japan

[73] Assignee: Hitachi, Ltd., Tokyo, Japan

[21] Appl. No.: 364,458

[22] Filed: Jun. 12, 1989

[30] Foreign Application Priority Data

Jun. 14, 1988 [JP] Japan ............................... 63-146008
Jul. 13, 1988 [JP] Japan ............................... 63-172721

[51] Int. Cl.⁵ ..................... G11C 7/02; G06F 11/16
[52] U.S. Cl. .................................. 365/201; 365/207; 371/21.1; 371/21.2
[58] Field of Search .......... 365/201, 203, 205, 189.09, 365/189.07, 202, 210, 230.03, 207, 208; 371/21.1, 21.2

[56] References Cited

U.S. PATENT DOCUMENTS 4,138,740 2/1979 Itoh ..................................... 365/203
4,916,700 4/1990 Ito et al. ............................ 365/201

Primary Examiner—James W. Moffitt
Assistant Examiner—Jack A. Lane
Attorney, Agent, or Firm—Antonelli, Terry, Stout & Kraus

[57] ABSTRACT

In a multibit test mode for a dynamic RAM, a plurality of complementary data lines are simultaneously connected to the complementary common data lines and the levels of noninversion signal lines and inversion signal lines of the complementary common data lines are compared with a predetermined reference voltage, respectively.

26 Claims, 7 Drawing Sheets

SEMICONDUCTOR MEMORY DEVICE

BACKGROUND OF THE INVENTION

The present invention relates to a semiconductor memory device and an art which is particularly effective for application, for example, into a large capacity dynamic RAM (Random Access Memory) having a multibit test function.

Some kinds of dynamic RAM have a comparatively large capacity and the so-called multibit test system has been proposed as a method for effectively testing the functions of such dynamic RAM in view of realizing low cost function test.

The multibit test method, for example, has been described in the specification of U.S. Ser. No. 156,897 filed on Feb. 17, 1988.

Investigations by the inventors of the present invention have proved that with improvement in capacity of dynamic RAM, following problem occurs in the multibit test method of the prior art described above. Namely, the dynamic RAM employing such multibit test method is provided with a plurality of memory arrays including a plurality of complementary common data lines and main amplifiers provided corresponding to such memory arrays. When the dynamic RAM is set to the multibit test mode, the one memory cell is respectively set to the selected condition for each complementary data line and the same data is written or read for these memory cells. As a result, when all read data match, the dynamic RAM is judged normal and a high level or low level output signal corresponding to such read data is output. In this case, if the data including difference of even one bit is read out, the dynamic RAM is judged defective, providing a high impedance output.

Namely, in the multibit test method of the prior art described above, it is essential to provide the dynamic RAM with a plurality of complementary common data lines and main amplifiers corresponding to the number of memory cells which are set simultaneously in the selected conditions, namely the number of bits of data simultaneously read or written. It becomes a large factor to interfere high density integration of dynamic RAM and prevent from decrease manufacturing cost when the dynamic RAM has come to have a large capacity such as, for example, 16 Mbits or 64 Mbits. Moreover, when the number of bits to be tested simultaneously in the multibit test mode is reduced in order to avoid such factor, the test cost of dynamic RAM increases on the contrary.

SUMMARY OF THE INVENTION

It is an object of the present invention to provide a semiconductor memory device such as a dynamic RAM which has increased the number of bits for the multibit test function without sacrificing high integration density. It is another object of the present invention to further realize low cost by curtailing testing cost of a semiconductor memory device such as a high capacity dynamic RAM.

These and other objects and features of the present invention will become apparent from the following description taken in conjunction with the preferred embodiment thereof which reference to the accompanying drawings.

The present application briefly describes as follow. Namely, a plurality of complementary data lines are connected simultaneously to the complementary common data lines in the multibit test mode of a dynamic RAM and the levels of non-inversion signal lines and inversion signal lines of the complementary common data lines are respectively compared with predetermined reference voltage.

According to the means described above, it can be confirmed that the signals read out from a plurality of complementary data lines connected to the complementary common data lines are in the same logical level by deciding, in the multibit test mode, that a level of the non-inversion signal line or inversion signal line of the complementary common data line is higher than such reference voltage, in other words, the non-inversion or inversion signal line is kept at the predetermined precharge level. Therefore, the number of bits of multibit test mode can be increased without expanding the complementary common data lines and main amplifiers, namely sacrificing high integration density of dynamic RAM. Thereby, testing cost of a large capacity dynamic RAM can be curtailed, leading to reduction in manufacturing cost.

DESCRIPTION OF THE PREFERRED EMBODIMENT

Figure 5:
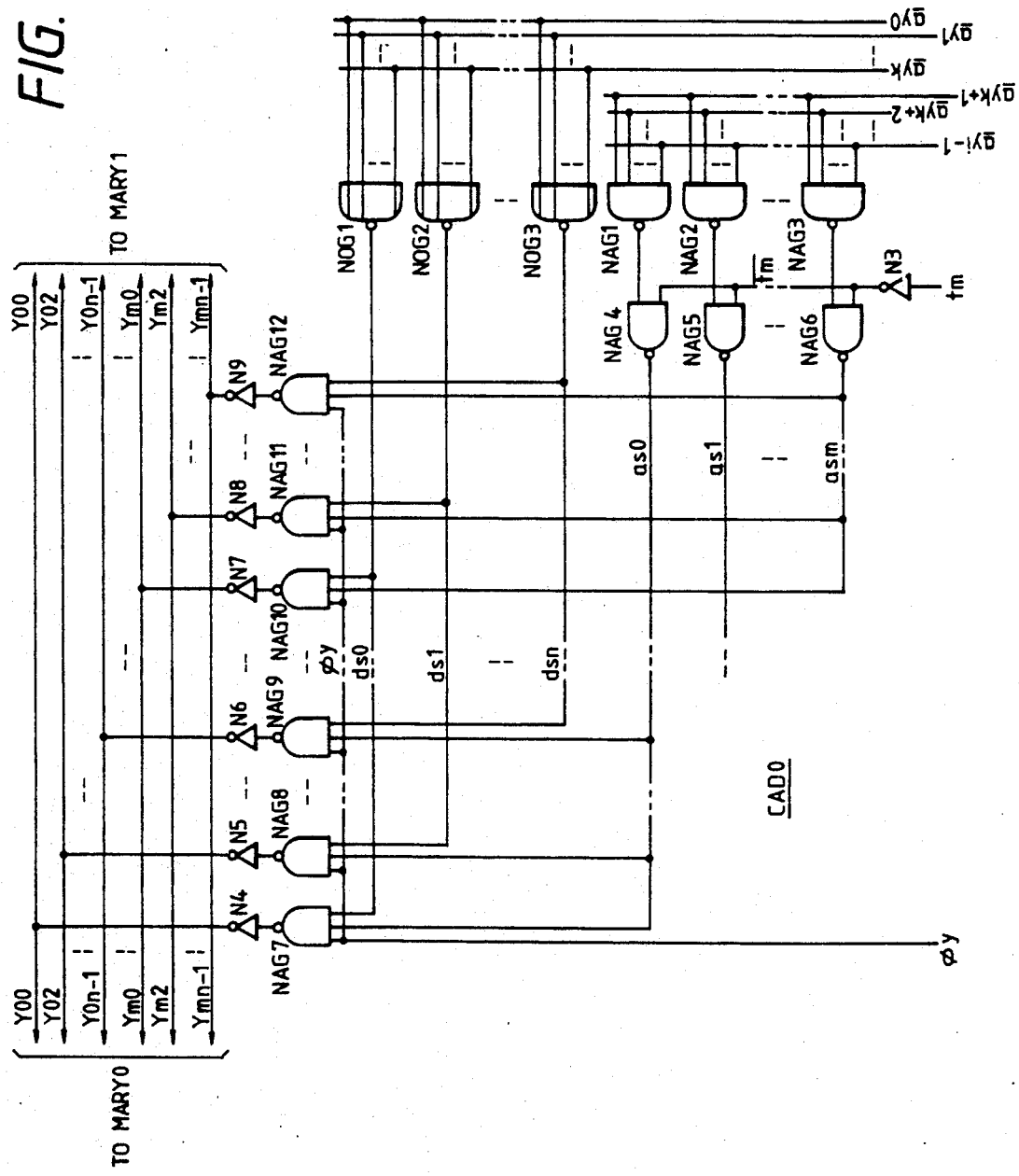
FIG. 5 is a circuit diagram showing an embodiment of a column address decoder of a dynamic RAM to which the present invention is applied.
Figure 6:
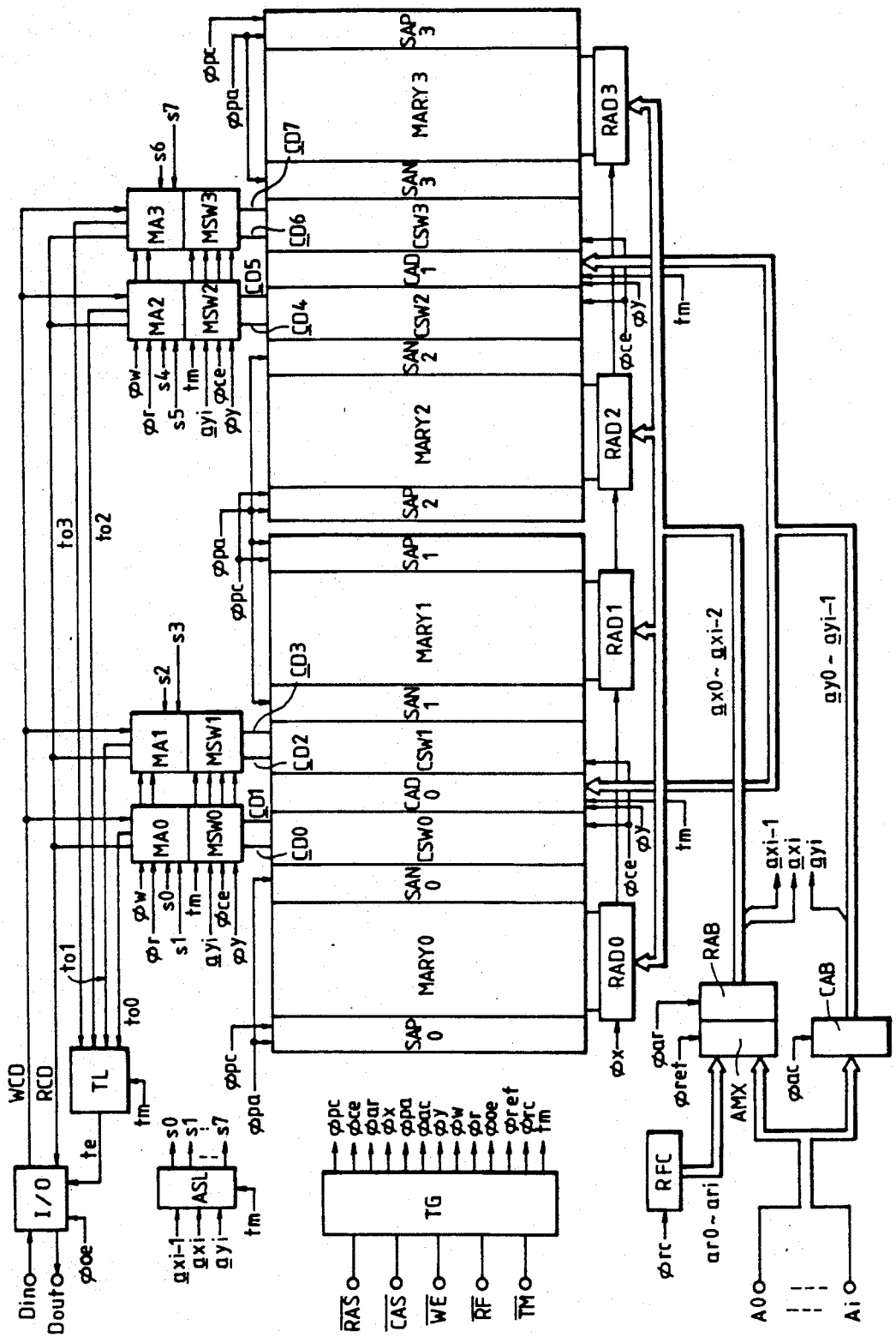
FIG. 6 is a block diagram showing an embodiment of a dynamic RAM to which the present invention is applied.

FIG. 6 is a block diagram showing an embodiment of a dynamic RAM to which the present invention is applied. Moreover, FIG. 1, FIG. 2 and FIG 5 respectively show the embodiments of the circuit diagram of the memory array and the peripheral circuit thereof of a dynamic RAM, memory array switching circuits and main amplifiers, and column address decoder. A structure and outline of operations of the dynamic RAM in such embodiments will be explained with reference to these figures. The circuit elements of FIG. 1, FIG. 2 and FIG. 5 and those forming blocks of FIG. 6 are formed on the one semiconductor substrate such as a single crystal silicon, although not limited particularly, by the well known semiconductor integrated circuit manufacturing technique. Meanwhile, in the following figure, MOSFETs given the arrow marks in the channel (back gate) part are of the P-channel type and are distinguished from the N-channel MOSFETs not given the arrow marks.

The dynamic RAM of this embodiment includes, although not particularly limited, four memory arrays MARY0~MARY3 and total of eight pairs of complementary common data lines CD0~CD7, two pairs each corresponding to these four memory arrays, (here, a pair of noninversion signal line CD0 and inversion signal line $\overline{CD0}$ are indicated as complementary common data line CD0). In this embodiment, the memory arrays MARY0~MARY3 respectively have, as explained later, m+1 sub-memory arrays. The complementary common data lines CD0~CD1 to CD6~CD7 are respectively connected, although not particularly limited, to the corresponding main amplifiers MA0~MA3 via the corresponding main amplifier switching circuits MSW0~MSW3. The main amplifiers MA0~MA3 respectively include two read amplifiers and write amplifiers.

In case the dynamic RAM is set to the ordinary read mode, the complementary common data lines CD0~CD7 are respectively connected, one by one, with the designated two memory cells of the corresponding memory arrays MARY0~MARY3. In this case, two read amplifiers provided in each main amplifier are respectively connected with corresponding complementary common data lines CD0~CD7 and amplify the signal read out from the output of selected memory cell.

In case the dynamic RAM is set to the multibit test mode, the complementary common data lines CD0~CD7 are connected, one by one, with total of m+1 memory cells simultaneously from each submemory array of the corresponding memory arrays MARY0~MARY3. In this case, two read amplifiers provided in each main amplifier are selectively connected with only the one of a pair of complementary common data lines CD0·CD1 or CD6·CD7. That is, the noninversion input terminals of two read amplifiers provided in each main amplifier are respectively connected with the noninversion signal line and inversion signal line of the corresponding complementary common data lines CD0 or CD1 to CD6 or CD7, while the inversion input terminals are supplied in common with the predetermined reference voltage. The reference voltage mentioned above is set, although not particularly limited, to almost the intermediate level of the high and low levels of the readout signal output to each complementary common data lines in the ordinary readout mode. Therefore, two read amplifiers provided in the main amplifier function as the first and the second differential amplifier circuits which compare the levels of noninversion signal line and inversion signal line of the corresponding complementary common data lines with the reference voltage described above and decide that the levels of these signal lines are higher than the reference voltage and are kept at the predetermined precharge level. Thereby, such read amplifiers identify that the readout signals of m+1 memory cells connected to each complementary common data line are in the same logic level and send the result to the test logic circuit TL. The test logic circuit TL has a function to collect test results transmitted from the respective main amplifiers.

As a result, the dynamic RAM of this embodiment has the function to simultaneously select total of [4×(m+1)] memory cells and execute the multibit test for these memory cells. It is certain that increase in the number of bits for the multibit test function can be realized without expansion of the complementary common data lines and main amplifiers, in other words, without interfering high integration density of a dynamic RAM. Accordingly, the testing cost of dynamic RAM can be curtailed, leading to remarkable reduction in manufacturing cost.

In FIG. 6, the dynamic RAM of this embodiment includes, although not particularly limited, two column address decoders CAD0 and CAD1 and four memory arrays MARY0, MARY1 and MARY2, MARY3 disposed in both sides of these column address decoders.

Figure 1:
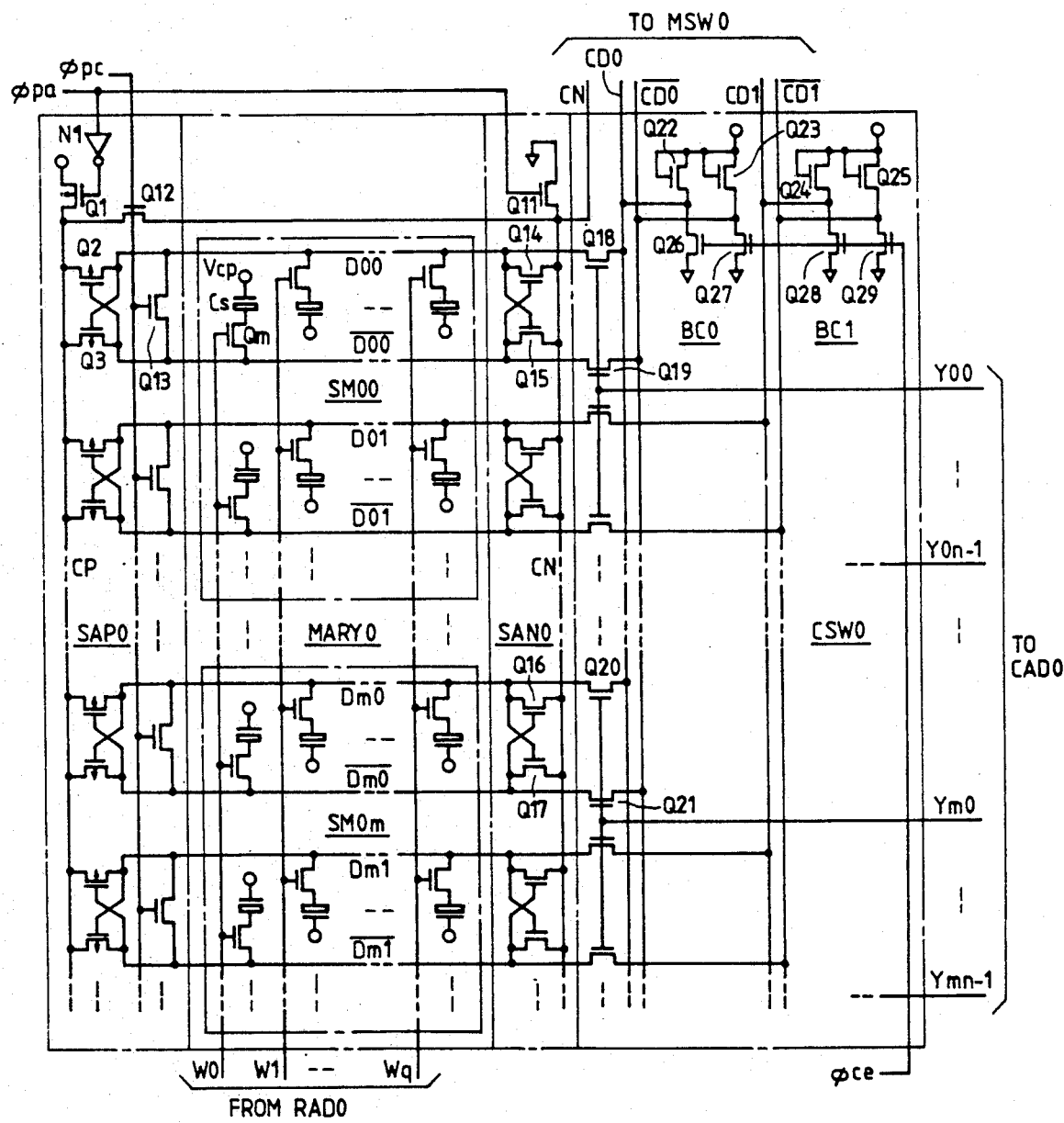
FIG. 1 is a circuit diagram showing an embodiment of a memory array and peripheral circuit thereof of a dynamic RAM to which the present invention is applied.

The memory array MARY0 includes, although not particularly limited, m+1 submemory arrays SM00~SM0m as shown in FIG. 1. These submemory arrays respectively include, although not particularly limited, q+1 word lines W0~Wq disposed, as the 2-intersecting point system, in the vertical direction through the submemory arrays, n+1 pairs of complementary data lines D00·$\overline{D00}$~D0n·$\overline{D0n}$ to Dm0·$\overline{Dm0}$~Dmn·$\overline{Dmn}$ disposed in the horizontal direction and (q+1)×(n+1) dynamic memory cells arranged in the form of array at the intersecting points of the word lines and complementary data lines.

The memory array MARY1 is formed symmetrically in structure to such memory array. Moreover, the memory arrays MARY2 and MARY3 are formed correspondingly in structure to the memory arrays MARY0 and MARY1, forming a pair.

The dynamic memory cells forming the memory arrays MARY0~MARY3 respectively include, although not particularly limited, an information storage capacitor Cs and an address selection MOSFET Qm connected in series. To the other terminal of the information storage capacitor Cs, a predetermined cell plate voltage Vcp is supplied in common. In each memory array, the drains of address selection MOSFETs Qm of q+1 memory cells disposed in the same column are alternately coupled, in the predetermined rule, with the noninversion signal lines or inversion signal lines of the corresponding complementary common data lines D00·$\overline{D00}$~D0n·$\overline{D0n}$ to Dm0·$\overline{Dm0}$~Dmn·$\overline{Dmn}$. In addition, the gates of address selection MOSFETs of (m+1)×(n+1) memory cells disposed in the same row are coupled in common with the corresponding word lines W0~Wq.

The word lines W0~Wq forming the memory arrays MARY0~MARY3 are respectively coupled with the corresponding row address decoders RAD0~RAD3 and only a line is selected.

To the row address decoders RAD0~RAD3, although not particularly limited, the i-1 bits complementary internal address signals ax0~axi−2 (here, combination of the noninversion internal address signal ax0 and inversion address signal $\overline{ax0}$ is indicated by complementary internal address signal ax0, and it is also referred hereinafter) are supplied in common and a timing signal 0 x is supplied in common from a timing generation circuit TG. Here, the timing signal 0 x is usually set to a low level and is then turned to a high level in the predetermined timing when the dynamic RAM is selected.

The row address decoders RAD0~RAD3 are selectively operated when the timing signal 0 x turns to the high level. In this operating condition, the row address decoders RAD0~RAD3 decode such complementary internal address signals ax0~axi−2 and select, in the high level, the one of the corresponding word lines W0~Wq of the corresponding memory arrays MARY0~MARY3.

The row address buffer RAB fetches a row address signal sent through the address multiplexer AMX in accordance with a timing signal 0 ar supplied from the timing generation circuit TG and then hold such signal. Depending on such row address signal, the i+1 bits complementary internal address signals $ax0 \sim axi$ are formed. Among these signals, the complementary internal address signals $axi-1$ and $axi$ of upper 2 bits are supplied, although not particularly limited, to the array selection circuit ASL, while the other complementary internal address signals $ax0 \sim axi-2$, to such row address decoders $RAD0 \sim \overline{RAD3}$ in common.

To the one input terminal of the address multiplexer AMX, the X address signals $AX0 \sim AXi$ to be supplied on the time sharing basis through the external terminals $A0 \sim Ai$ are input, while to the other input terminal thereof, the refresh address signals $ar0 \sim ari$ are input from the refresh address counter RFC. Moreover, to the address multiplexer AMX, the timing signal 0 ref is supplied as the selection control signal from the timing generation circuit TG.

The address multiplexer AMX selects, when the dynamic RAM is in the ordinary operation mode and the timing signal 0 ref is in the low level, the X address signals $AX0 \sim AXi$ supplied through the external terminals $A0 \sim Ai$ and sends them as the row address signals to the row address buffer RAB. Moreover, when the dynamic RAM is in the refresh mode and the timing signal 0 ref is in the high level, the address multiplexer AMX selects the refresh address signals $ar0 \sim ari$ supplied from the refresh address counter RCF and sends them as the row address signals to the row address buffer RAB.

The refresher address counter RFC is selectively set to the operating condition when the dynamic RAM is in the refresh mode. In this operating condition, the refresh address counter RFC makes incremental operation in accordance with the timing signal 0 rc supplied from the timing generation circuit TG to create the refresh address signals $ar0 \sim ari$. These refresh address signals are supplied, as described above, to the other input terminal of the address multiplexer AMX.

The complementary data lines $D00 \cdot \overline{D00} \sim D0n \cdot \overline{D0n}$ to $Dm0 \cdot \overline{Dm0} \sim Dmn \cdot \overline{Dmn}$ forming the memory array MARY0 MARY3 are respectively coupled, in one hand, as represented by the memory array MARY0 of FIG. 1, to a corresponding unit circuit of the corresponding P type sense amplifiers $SAP0 \sim SAP3$, and on the other hand, to the corresponding switches MOSFETs Q18·Q19~Q20·Q21, for example, of the corresponding column switches $CSW0 \sim CSW3$ through the corresponding unit circuit of the corresponding N type sense amplifiers $SAN0 \sim SAN3$.

The p type sense amplifiers $SAP0 \sim SAP3$ include $(m+1) \times (n+1)$ unit circuits disposed corresponding to each complementary data lines of memory arrays $MARY0 \sim MARY3$. These unit circuits respectively include, although not particularly limited, to P channel MOSFETs Q2, Q3 in which the gates and drains thereof are cross-connected to each other and an N channel precharge MOSFET Q13 interposed between the noninversion signal line and inversion signal line of the corresponding complementary data line.

The sources of MOSFETs Q2 and Q3 are connected in common to the common source line CP and moreover connected to the power source voltage of the circuit through the P channel drive MOSFET Q1. Here, the power source voltage of circuit is set, although not particularly limited, to a positive power source voltage of +5 V. To the gate of drive MOSFET Q1, a signal inverted by an inverted circuit N1 of the timing signal 0 pa supplied from the timing generation circuit TG is supplied. Here, the timing signal 0 pa is usually set to a low level and is turned to the predetermined high level when the dynamic RAM is selected. Thereby, the MOSFETs Q2 and Q3 are selectively operated when the timing signal 0 pa is high level and the drive MOSFET Q1 is ON and function as the one unit amplifying circuit in combination with the corresponding unit circuit of the corresponding N type sense amplifiers $SAN0 \sim SAN3$. In this operating condition, these unit amplifying circuits amplify minute readout signal output to the corresponding complementary data lines $D00 \cdot \overline{D00} \sim D0n \cdot \overline{D0n}$ to $Dm0 \cdot \overline{Dm0} \sim Dmn \cdot \overline{Dmn}$ from $(m+1) \times (n+1)$ memory cells coupled with the selected word lines, as the binary readout signal of high level and low level.

To the gate of MOSFET Q13 of each unit circuit of the P type sense amplifiers $SAP0 \sim SAP3$, the timing signal 0 pc is supplied in common from the timing generation circuit TG. Here, the timing signal 0 pc is selectively set to a high level when the dynamic RAM is in the non-selected condition. The MOSFET Q13, etc. are turned ON simultaneously when the dynamic RAM is in the non-selected condition and the timing signal 0 pc is in the high level, short-circuiting the noninversion signal line and inversion signal line of corresponding complementary data lines $D00 \cdot \overline{D00} \sim D0n \cdot \overline{D0n}$ to $Dm0 \cdot \overline{Dm0} \sim Dmn \cdot \overline{Dmn}$ and keeping them at the half-precharge level.

In the same way, each unit circuit of the N type sense amplifiers $SAN0 \sim SAN3$ includes, although not particularly limited, two N channel MOSFETs Q14·Q15 to Q16·Q17 in which the gate and drain are cross-connected to each other. The sources of these MOSFETs Q14·Q15 to Q16·Q17 are connected in common to the common source line CN and moreover connected to the ground potential of the circuit through the N channel drive MOSFET Q11. To the gate of drive MOSFET Q11, the timing signal 0 pa is supplied. Thereby, the MOSFETs Q14·Q15 to Q16·Q17 are selectively operated when the timing signal 0 pa is in the high level and the drive MOSFET Q11 is ON and function as the one unit amplifying circuit in combination with the corresponding unit circuit of the corresponding P type sense amplifiers $SAP0 \sim SAP3$.

The column switches $CSW0 \sim CSW3$ include, as represented by the column switch CSW0 in FIG. 1, the $(m+1) \times (n+1)$ pair of switch MOSFETs Q18, Q19 to Q20·Q21 provided corresponding to each complementary data lines of the corresponding memory arrays $MARY0 \sim MARY3$. The one pair of these switches MOSFETs, as explained previously, are respectively coupled with the corresponding complementary data lines of the corresponding memory arrays $MARY0 \sim MARY3$, while the other pair of them are connected in common sequentially and alternately with the corresponding two pairs of complementary common data line $CD0 \cdot DD1 \sim CD6 \cdot CD7$. The gates of two pair of switches MOSFETs adjacent to the column switches $CSW0 \sim CSW3$ are respectively connected in common and receive the supply of the corresponding data line selection signals $Y00 \sim Y0n-1$ to $Ym0 \sim Ymn-1$ from the corresponding column data decoders CAD0 or CAD1.

The data line selection signals Y00~Y0n−1 to Ym0-~Ymn−1 are usually set to a low level and the one of them is turned to a high level in the predetermined timing when the dynamic RAM is selected in the ordinary operation mode. In this case, the corresponding two pairs of switches MOSFETs in the column switches CSW0~CSW3 are turned ON and the corresponding two pairs of complementary data lines of memory arrays MARY0~MARY3 are selectively connected with the corresponding complementary common data lines $\overline{CD0 \cdot CD1}$ to $\overline{CD6 \cdot CD7}$. On the other hand, the dynamic RAM is selected in the multibit test mode, the corresponding data line selection signals Y00~Ym0 to Y0n−1~Ymn−1 of such data line selection signals Y00~Y0n−1 to Ym0~Ymn−1 are respectively turned to a high level simultaneously in unit of m+1 lines. In this case, the corresponding 2×(m+1) pairs of switches MOSFETs are turned ON simultaneously in the column switches CSW0~CSW3. As a result, the corresponding 2>(m+1) pairs of complementary data lines are selected form the submemory arrays SM00~SM0m to SM30~SM3m of the memory array MARY0~MARY3 and are connected selectively, in unit of m+1 pairs, to the corresponding complementary common data line $\overline{CD0 \cdot CD1}$ to $\overline{CD6 \cdot CD7}$.

By the way, as indicated in an example shown in FIG. 1, the column switches CSW0~CWS3 respectively include a couple of bias circuits BC0 and BC1 provided corresponding to the each pair of complementary common data line $\overline{C \cdot CD1}$ to $\overline{CD6 \cdot CD7}$. These bias circuits resepectively include, although not particularly limited, diode type N channel MOSFETs Q22~Q25 disposed between the noninversion signal line and inversion signal line of each complementary common data line and the power supply voltage of the circuit and N channel MOSFETS Q26~Q29 disposed between the noninversion signal line and inversion signal line of each complementary common data line and the ground potential of the circuit. MOSFETs Q26~Q29 are designed to have a negligible small conductance and the gates thereof receive, although not particularly limited, the common supply of the timing signal 0 ce from the timing generation circuit TG. Here, the timing signal 0 ce is selectively turned to a high level when the dynamic RAM is selected. Thereby, when the dynamic RAM is selected, the noninversion signal line and inversion signal line of complementary common data lines $\overline{CD0}$~$\overline{CD7}$ are set to the predetermined precharge level which is equal to a value obtained by subtracting the threshold voltage of MOSFETs Q22~Q25 of the bias circuits BC0 and BC1 from the power source voltage of the circuit. In addition, when the dynamic RAM is selected and the designated complementary data lines of memory arrays MARY0~MARY3 are selectively connected, the noninversion and inversion signal lines are selectively discharged and set to a predetermined low level.

Operations of the readout circuit including the complementary common data lines $\overline{CD0}$~$\overline{CD7}$ and bias circuits BC0 and BC1 of the column switches CSW0~CSW3 are explained later in detail.

To the column address decoders CAD0 and CAD1, the complementary internal address signals ay0~ayi−1 except for the most significant bit are supplied from the column address buffer CAB and the timing signal 0 y and internal control signal tm are supplied from the timing generation circuit TG. Here, the timing signal 0 y is usually set to a low level and is turned to a high level in the predetermined timing when the dynamic RAM is selected. The internal control signal tm is selectively set to a high level when the dynamic RAM is selected in the multibit test mode.

The column address decoders CAD0 and CAD1 include, although not particularly limited, as represented by the column address decoder CAD0 of FIG. 5, the n+1 NOR gate circuits NOG1~NOG3 which receive the lower digits of complementary internal address signals ay0~ayk through combination of corresponding negative logic and the m+1 NAND gate circuits NAG1~NAG3 which receive the upper digits of complementary internal address signals ayk+-1~ai−1 through combination of corresponding positive logic.

The output signals of NOR gate circuits NOG1-~NOG3 are respectively supplied, as the internal selection signals ds0~dsn, to the first input terminals of the corresponding NAND gate circuits NAG7~NAG9 to NAG10 NAG12. Only one of these internal selection signals ds0~dsn is turned to a high level when the noninversion internal address signals ay0~ayk or inversion internal address signals $\overline{ayo}$~$\overline{ayk}$ supplied through corresponding combination are all in the low level. In this case, the internal selection signals ds0~dsn are used as the selection signals for selecting only one of the corresponding complementary data line from each submemory array of memory array MARY0~MARY3.

On the other hand, the output signals of NAND gate circuits NAG1~NAG3 are respectively supplied to the one input terminal of the corresponding NAND gate circuits NAG4~NAG6. To the other input terminals of these NAND gate circuits NAG4~NAG6, the inversion signal line by the inverter circuit N3 of the internal control signal tm, namely inversion control signal $\overline{tm}$ is supplied in common. The output signals of NAND gate circuits NAF4~NAG6 are respectively supplied, as the internal selection signals as0~asm, in common to the second input terminals of the corresponding NAND gate circuits NAG7~NAG9 to NAG10~NAG12. Only one of the internal selection signal as0~asm is turned to a high level when the output signals of the corresponding NAND gates NAG1~NAG3 are set to a low level, namely when the non-inversion internal address signals ayk+1~ayi−1 or inversion internal address signals $\overline{ayk+1}$~$\overline{ayi-1}$ supplied through corresponding combination are all in a high level. In this case, the internal selection signals as0~asm are used as the selection signal for selecting only one submemory array from the submemory arrays SM00~SM0m to SM30~SM3m of the memory arrays MARY0~-MARY3. When the dynamic RAM is in the multibit test mode and the internal control signal tm is in a high level, the internal selection signals as0~asm are set in a high level simultaneously. As a result, as described later, total of 2×(m+1) pairs of complementary data lines, two pairs from each submemory array, are selected simultaneously from all submemory arrays of the memory arrays MARY0~MARY3.

To the third input terminals of NAND gate circuits NAG7~NAG9 to NAG10~NAG12, the timing signal 0 y is supplied in common. Output signals of these NAND gate circuits are inverted by the corresponding inverter circuits N4~N6 to N7~N9 and are then supplied, as the data line selection signals Y00~Y0n−1 to Ym0~Ymn−1, to the corresponding memory arrays MARY0, MARY1 or MARY2, MARY3. It is a matter of course that the data line selection signals Y00-~Y0n−1 to Ym0~Ymn−1 are set selectively to a high level with the condition that the timing signal 0 y is in a high level, when the corresponding internal selection signals ds0~dsn and as0~asm are in a high level.

Namely, when the dynamic RAM is selected in the ordinary operation mode, the one of the data line selection signals Y00~Y0n−1 to Ym0~Ymn−1 is set to a high level depending on the complementary internal address signals ay0~avi−1, since the timing signal 0 y is set to a high level and internal control signal tm is set to a low level. As a result, corresponding two pairs of complementary data lines are selected from the memory arrays MARY0~MARY3 and respectively connected to the complementary common data lines $\overline{CD0 \cdot CD1}$ to $\overline{CD6 \cdot CD7}$. Meanwhile, when the dynamic RAM is selected in the multibit test mode, the data line selection signals Y00~Y0n−1 to Ym0~Ymn−1 are set simultaneously to a high level in unit of m+1 lines in accordance with the lower digits of complementary internal address signals ay0~/e,uns/a/ yk, since the timing signal 0 y and internal control signal tm are set to a high level. As a result, total of 2×(m+1) pairs of complementary data lines, two pairs from each submemory array, are selected from all submemory arrays of memory arrays MARY0~MARY3 and are connected to the corresponding complementary common data lines $\overline{CD0 \cdot CD1}$ to $\overline{CD6 \cdot CD7}$ in unit of m+1 pairs.

The column address buffer CAB fetches and holds the Y address signals AY0~AYi supplied on the time sharing basis through the external terminals A0~Ai in accordance with the timing signal 0 ac supplied from the timing generation circuit TG. Moreover, this buffer creates the complementary internal address signals ay0~ayi of i+1 bits based on these Y address signals $\overline{AY0}$~$\overline{AYi}$. Of these signals, the complementary internal address signal ayi of the most significant bit is supplied, although not particularly limited, to an array selection circuit ASL and the other complementary internal address signals ay0~ayi−1 are supplied to the column address decoders CAD0 and CAD1.

The array selection circuit ASL decodes the complementary internal address signals axi−1, axi and ayi supplied from the row address buffer RAB and column address buffer CAB and selectively sets to a high level the one of selection signals s0~s7. These selection signals s0 s7 are respectively supplied to the corresponding main amplifier MA0~MA3.

The complementary common data lines $\overline{CD0 \cdot CD1}$~$\overline{CD6 \cdot CD7}$ are respectively coupled to the corresponding main amplifiers MA0~MA3 through the corresponding main amplifier switching circuits MSW0~MSW3. To the main amplifier switching circuits MSW0~MSW3, the internal control signal tm and timing signals 0 ce and 0 y are supplied from the timing generation circuit TG. Moreover, the complementary internal address signal ayi of the most significant bit is also supplied thereto from the column address buffer CAB. The timing signals 0 w and 0 r are also supplied to the main amplifiers MA0~MA3 from the timing generation circuit TG and combinations of the corresponding selection signals s0·s1 to s6·s7 are also supplied thereto from the array selection circuit ASL. Here, the timing signal 0 w is set to a high level temporarily in the predetermined timing when the dynamic RAM is selected in the write mode. Moreover, the timing signal 0 r is set to a high level in the predetermined timing when the dynamic RAM is selected in the read mode.

Figure 2:
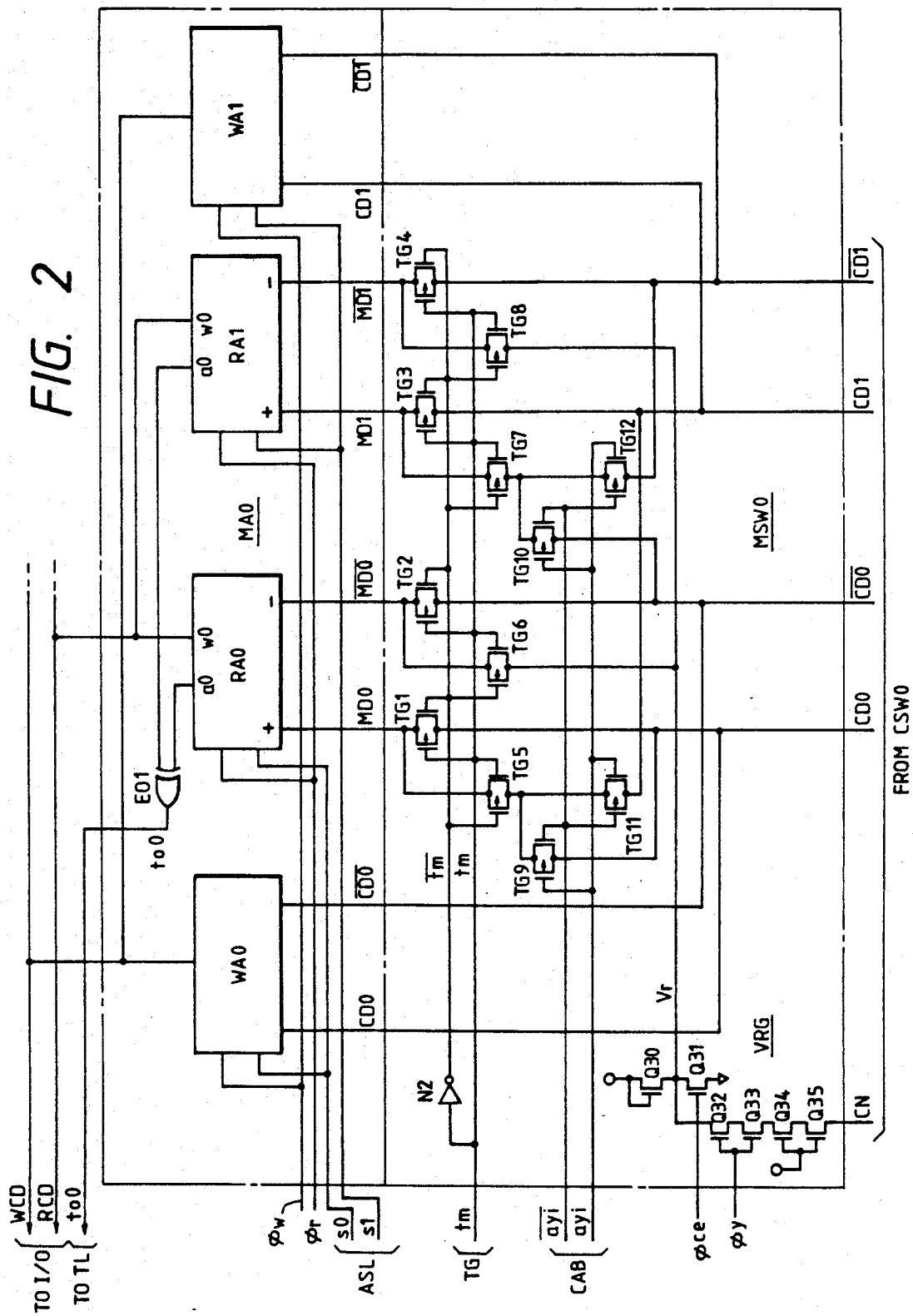
FIG. 2 is a block diagram of the circuit showing an embodiment of main amplifiers and main amplifier switching circuits of a dynamic RAM to which the present invention is applied.

The main amplifier switching circuits MSW0~MSW3 include, although not particularly limited, as represented by the main amplifier switching circuit MSW0 of FIG. 2, 12 transmission gates TG1~TG12, each gate consisting of a pair of P channel MOSFET and N channel MOSFET. The P channel MOSFET and N channel MOSFET forming such transmission gate are designed, although not particularly limited, to have a conductance comparatively as large as giving no influence on the level of signal to be transmitted through the complementary common data lines. Here, the internal control signal tm and its inverted signal by the inverter circuit N2, namely the inversion internal control signal $\overline{tm}$ are supplied to the transmission gates TG1~TG4 and TG5~TG8 through the predetermined combinations. Moreover, the noninversion internal address signal ayi and inversion internal address signal $\overline{ayi}$ are also supplied to the transmission gates TG9, TG10 and TG11, TG12 through the predetermined combinations. As a result, the transmission gates TG1~TG4 are selectively set to the transmission mode when the dynamic RAM is in the ordinary operation mode and the internal control signals tm is in a low level, while the transmission gates TG5~TG8 are selectively set to the transmission mode when the dynamic RAM is in the multibit test mode and the internal control signal tm is a high level. In the same way, the transmission gate TG9 and TG10 are selectively set to the transmission mode when the complementary internal address signals ayi are logic "0", while the transmission gates TG11 and TG12 are selectively set to the transmission mode when the complementary internal address signals avi are logic "1".

From these facts, the complementary common data lines $\overline{CD0 \cdot CD1}$ to $\overline{CD6 \cdot CD7}$ are respectively connected, when the dynamic RAM is in the ordinary operating mode and the internal control signal tm is in a low level, to the noninversion input terminal+and inversion input terminal−of the read amplifiers RA0 and RA1 of corresponding main amplifiers MA0~MA3 through the transmission gates TG1~TG4 of the corresponding main amplifier switching circuits MSW0~MSW3. On the other hand, when the dynamic RAM is in the multibit test mode and the internal control signal tm is in a high level, only one of the complementary common data lines $\overline{CD0 \cdot CD1}$ to $\overline{CD6 \cdot CD7}$ are selected in accordance with the complementary internal address signals ayi. In this case, the noninversion signal line of selected complementary common data lines is connected to the noninversion input terminal+of the read amplifier RA0 of the corresponding main amplifiers MA0~MA3 through the transmission gates TG5 and TG9 or TG11 of the corresponding main amplifier switching circuits MSW0~MSW3. Moreover, the inversion signal line of selected complementary common data lines is connected to the noninversion input terminal+of read amplifier RA1 of the corresponding main amplifiers MA0~MA3 through the transmission gates TG7 and TG10 or TG12 of the corresponding main amplifier switching circuits MSW0~MSW3 To the inversion input terminal−of the read amplifiers RA0 and RA1, the predetermined reference voltage Vr is supplied through the transmission gates TG6 and TG8 of the corresponding main amplifier switching circuits MSW0~MSW3.

Here, the main amplifier switching circuits MSW0~MSW3 respectively include, although not particularly limited, regulated voltage generating circuits VRG to form the reference voltage Vr. These regulated voltage generating circuit VRG respectively include, although not particularly limited, the N channel MOSFETs Q30 and Q31 provided in series between the power source voltage and ground potential of the circuit and four N channel MOSFETs Q32~Q35 provided in series between the source and drain connected in common and the common source line CN of the MOSFETs Q30 and Q31. Here, the MOSFET Q30 is designed to have the electrical characteristics same as that of the MOSFETs Q22~Q25 included in the bias circuits BC0 and BC1 of the column switches CSW0~CSW3, while the MOSFET Q31 is designed to have the electrical characteristics same as that of the MOSFETs Q26~Q29 included in the bias circuits BC0 and BC1. Moreover, the MOSFETs Q32 and Q33 are designed to have the electrical characteristics same as that of the MOSFETs Q18·Q19~Q20·Q21, while the MOSFETs Q34 and Q35, to have the electrical characteristics same as that of the MOSFETs Q14·Q15 to Q16·Q17 of the N type sense amplifiers SAN0~SAN3. The MOSFET Q30 is of the diode type through common coupling of the gate and drain thereof. The timing signal 0 ce is supplied to the gate of MOSFET Q31, while the timing signal 0 y is supplied in common to the gates of MOSFETs Q32 and Q33. The gates of MOSFETs Q34 and Q35 are connected in common and further connected to the power source voltage of the circuit. The potential of source and drain connected in common of the MOSFETs Q30 and Q31 is considered as the reference voltage Vr.

From these facts, the reference voltage Vr is set to the predetermined precharge level which is equal to a value obtained by subtracting the threshold voltage of MOSFET Q30 from the power source voltage of the circuit since the MOSFET Q31 and MOSFETs Q32 and Q33 are in the OFF condition when the dynamic RAM is in the non-selected mode and the timing signals 0 ce and 0 y are in a low level. When the dynamic RAM is selected and the timing signals 0 ce, 0 y are in a high level, the MOSFETs Q31, Q32 and Q33 are set to the ON condition. As a result, the reference voltage Vr is substantially in the predetermined level which is determined by a ratio between the combined conductance of the MOSFETs Q32~Q35 and a conductance of MOSFET Q30.

When the dynamic RAM is not selected, as described previously, the noninversion signal line and inversion signal line of the complementary common data lines CD0~CD7 are precharged by the corresponding bias circuits BC0 or BC1 of corresponding column switches CSW0~CSW3. The one of these precharge levels is selectively pulled and is set to the predetermined low level through the corresponding switches MOSFETs Q18·Q19~Q20·Q21 of the corresponding column switches CSW0~CSW3 and the corresponding MOSFETs Q14·Q15~Q16·Q17 of the corresponding N type sense amplifiers SAN0~SAN3, when the dynamic RAM is selected in the ordinary read mode and the one of designated complementary data lines is connected. Here, the low level of the pulled complementary common data lines is determined by a ratio between a combined conductance of the MOSFETs Q18 and Q14 to Q20·Q16 or MOSFETs Q19·Q15 to Q21·Q17 and a conductance of MOSFETs Q22~Q25 of the corresponding bias circuits BC0 or BC1. As described previously, MOSFET Q30, MOSFETs Q32, Q33 and MOSFETs Q34, Q35 of the regulated voltage generating circuit VRG are designed to have the electrical characteristic same as that of MOSFETs Q22~Q25 of bias circuits BC0 or BC1 and switches MOSFETs Q18·Q19~Q20·Q21 of the column switches CSW0~CSW3, and MOSFETs Q14·Q15~Q16·Q17 of the N type sense amplifiers SAN0~SAN3. As a result, the reference voltage Vr when the dynamic RAM is selected is substantially set to almost the intermediate level between the precharge level of complementary common data lines and low level of the pulled complementary common data lines, namely to the intermediate level of the high and low levels of the read signal output to the complementary common data lines in the ordinary read mode.

The main amplifiers MA0~MA3 respectively include, although not particularly limited, as represented by the main amplifier MA0 of FIG. 2, two write amplifiers WA0, WA1 and read amplifiers RA0, RA1. Of these amplifiers, the input terminals of write amplifiers WA0 and WA1 are connected in common, although not particularly limited, to the output terminals of data input buffers of data input/output circuits I/O through the write common data line WCD, while the output terminals thereof are respectively connected to the corresponding complementary common data lines CD0·CD1 to CD6·CD7. Moreover, the input terminals of the read amplifiers RA0 and RA1 are selectively connected in the predetermined combination, as explained above, to the corresponding complementary common data lines CD0·CD1 to CD6·CD7 or such reference voltage Vr, through the corresponding main amplifier switching circuits MSW0~MSW3.

In this embodiment, the read amplifiers RA0 and RA1 are provided, although not particularly limited, with the output terminal ao to which an output signal is output in the ordinary logic level and another output terminal wo which is directly coupled in the form of OR wiring. The output terminals ao of the read amplifiers RA0 and RA1 are respectively connected, although not particularly limited, to a pair of input terminals of the corresponding exclusive OR circuit EO1. The output terminals wo of the read amplifiers RA0 and RA1 are connected in common to the input terminals of the data output buffers of data input/output circuits I/O through the readout common data line RCD. The output signals of exclusive OR circuits EO1 of the main amplifiers MA0~MA3 are supplied to the test logic circuit TL as the test output signals to0~to3.

To the write amplifiers WA0 and WA1 of the main amplifiers MA0~Ma3, the timing signal 0 w is supplied in common and the corresponding selection signals s0·s1 to s6·s7 are supplied from the array selection circuit ASL. In the same way, to the read amplifiers RA0 and RA1 of main amplifiers MA0~MA3, the timing signal 0 r is supplied in common and the corresponding selection signals S0·S1 to S6·s7 are also supplied respectively from the array selection circuit ASL. Here, the selection signals s0~s7 are usually set, although not particularly limited, to a low level and the one of such selection signals is set to a high level in accordance with the complementary internal address signals axi−1, axi and ayi when the dynamic RAM is selected in the ordinary operation mode. While the dynamic RAM is selected in the multibit test mode, the selection signals s0~s7 are set simultaneously to a high level without relation to the complementary internal address signals.

The write amplifiers WA0 and WA1 of main amplifiers MA0~MA3 are selectively operated when the timing signal 0 w is set to a high level and simultaneously the corresponding selection signals s0~s7 are also set to a high level. In this operating conditions, the write amplifiers WA0 and WA1 generate the complementary write signals in accordance with the write data to be supplied from the data input buffers of data input/output circuits I/O through the write common data line WCD and send such signals to the corresponding complementary common data lines $CD0 \cdot \overline{CD1} \sim CD6 \cdot \overline{CD7}$.

The read amplifiers RA0 and RA1 of main amplifiers MA0~MA3 are selectively operated since the timing signal 0 r is set to a high level and the one of selection signals s0~s7 is also set to a high level when the dynamic RAM is in the ordinary read mode. In this operating condition, the read amplifiers RA0 and RA1 further amplify the binary signal read out form the selected memory cells of the corresponding memory arrays MARY0~MARY3 through the corresponding complementary common data lines $CD0 \cdot \overline{CD1}$ to $CD6 \cdot \overline{CD7}$ and then send such binary signals to the data output buffers of the data input/output circuits I/O through the readout common data line RCD. When the dynamic RAM is in the multibit test mode, the noninversion input terminals + of the read amplifiers RA0 and RA1 are connected, as explained previously, with the noninversion signal line and inversion signal line of the corresponding complementary common data lines $CD0$, $\overline{CD2}$, $CD4$, $\overline{CD6}$ or $\overline{CD1}$, $CD3$, $\overline{CD5}$, $CD7$ and the predetermined reference voltage Vr is also supplied in common to the inversion input terminals −. In this case, the read amplifiers RA0 and RA1 respectively function as differential amplifier circuits for comparing the signal levels of noninversion signal line and inversion signal line of the complementary common data lines coupled to the noninversion input terminals + with the reference voltage Vr supplied to the inversion input terminals −. The output signals ao of read amplifiers RA0 and RA1 are set to a logical low level, when level of the noninversion signal line or inversion signal line of corresponding complementary common data lines, for example, is lower than the reference voltage Vr and set to a logical high level, when such level is higher, on the contrary, than the reference voltage Vr. In case the result of multibit test of dynamic RAM is normal, the output signals ao of read amplifiers RA0 and RA1 will be complementarily set, as will be described later, to a high level or a low level. Therefore, it can be confirmed that 4×(m+1) memory cells selected in the multibit test are all normal, by deciding that the output signals of exclusive OR circuit EO1, namely the test output signals to0~to3 are all logically in a high level.

To the test logic circuit TL, the test output signals to0~to3 are supplied from the main amplifiers MA0~MA3 and the internal control signal tm is also supplied from the timing generation circuit TG.

The test logic circuit TL is selectively operated when the dynamic RAM is in the multibit test mode and the internal control signal tm is in a high level. In this operating condition, the test logic circuit TL selectively sets the output signal thereof, namely the error detection signal te to a low level or a high level in accordance with the test output signals to0~to3. Namely, when the test output signals to0~to3 are all in a high level, the test logic circuit TL sets, although not particularly limited, the error detection signal te to a low level, indicating that the result of multibit test is normal. When any of the test output signals to0~to3 is set to a low level, the test logic circuit TL sets the error detection signal te to a high level, indicating that the result of multibit test is abnormal. The error detection signal te is supplied to the data input/output circuits I/O.

The data input/output circuit I/O includes, although not particularly limited, data input buffer and data output buffer. To the data output buffer, the timing signal 0 oe is supplied from the timing generation circuit TG, while the error detection signal te from the test logic circuit TL. Here, the timing signal 0 e is usually set, although not particularly limited, to a low level and is set temporarily to a high level at the predetermined timing when the dynamic RAM is selected in the read mode.

The data input buffer of data input/output circuit I/O fetches, when the dynamic RAM is in the write mode, the write data supplied via the data input terminal Din and then holds this data. These write data are supplied in common to the write amplifiers WA0 and WA1 of the main amplifiers MA0~MA3 via the write common data line WCD. On the other hand, the data output buffer of data input/output circuit I/O is selectively operated since the timing signal 0 oe is in a high level when the dynamic RAM is in the read mode. Under this operating condition, the data output buffer sends the read data supplied from the read amp'ifiers RA0 and RA1 of main amplifiers MA0~MA3 via the read common data line RCD to external circuits through the data output terminals Dout. When the dynamic RAM is in the multibit test mode and the error detection signal te is in a high level because the test result is abnormal, the data output buffer sets an output thereof to a high impedance.

The timing generation signal TG generates a variety of internal control signals and timing signal in accordance with the row address strobe signal $\overline{RAS}$, column address strobe signal $\overline{CAS}$, write enable signal $\overline{WE}$, refresh control signal $\overline{RF}$ and test mode signal $\overline{TM}$ supplied as the control signals from external circuits and supplies the signals to each circuit.

Figure 3:
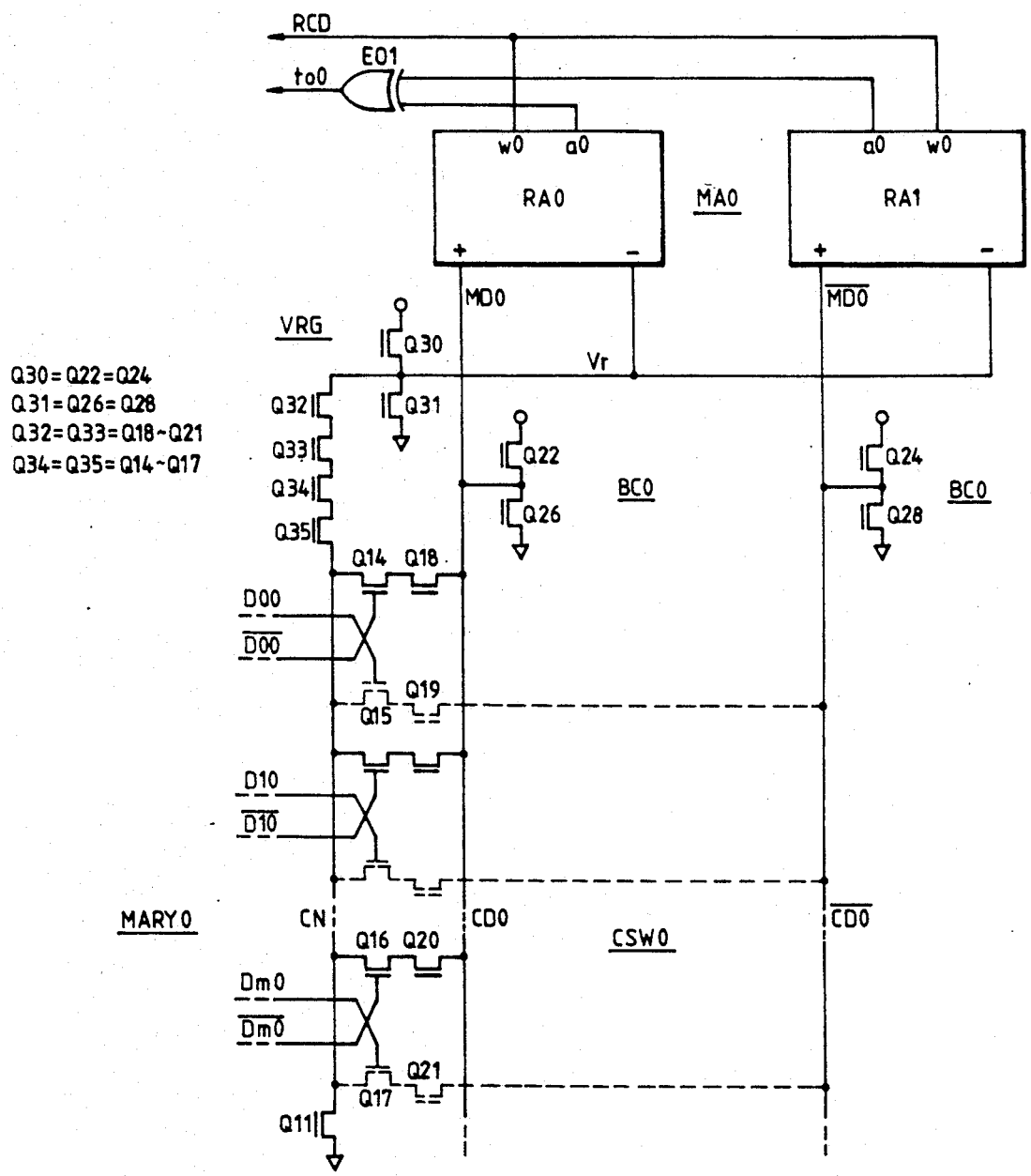
FIG. 3 is an equivalent circuit showing an embodiment of a readout circuit of a dynamic RAM to which the present invention is applied.

FIG. 3 is an equivalent circuit diagram of an embodiment of the read circuit of the dynamic RAM shown in FIG. 6. FIG. 4 shows signal waveforms in an embodiment of ordinary read mode and multibit test mode of the read circuit shown in FIG. 3. In FIG. 3, a memory array MARY0 and a corresponding read circuit consisting of an N type sense amplifier SAN0, a column switch CSW0, main amplifier MA0 and complementary common data lines $CD0$ are indicated as the examples. In FIG. 4, the complementary common data lines CD0 corresponding to the memory array MARY0 are indicated as the example with the noninversion signal line CD0 with a solid line and inversion signal line $\overline{CD0}$ with a dotted line. In FIG. 4, the vertical axis indicates signal level v of each signal line and the horizontal axis, passage of time. Outline of the multibit test mode of the dynamic RAM in this embodiment will be explained hereunder with an example where the respective complementary data lines $D00 \cdot \overline{D00} \sim Dm0 \cdot \overline{Dm0}$ selected simultaneously in the submemory arrays SM00~SM0m of the memory array MARY0.

In the multibit test mode of dynamic RAM in this embodiment, total of 4×(m+1) memory cells are selected from the memory arrays MARY0~MARY3 (m+1 cells, from each MARY) and the same test data is written. Thereafter, these memory cells are selected again and stored data are then read. In the write operation of multibit test mode, the complementary write signals are supplied, from the corresponding write amplifiers WA0 or WA1 of main amplifiers MA0~MA3, in accordance with the test data, to the m+1 memory cells selected from each memory array through the corresponding complementary common data lines CD0·CD1 to CD6·CD7. When the read mode of multi-bit test mode is started, the m+1 memory cells are selected again and connected as shown in FIG. 3.

In FIG. 3, the noninversion signal line CD0 of the complementary common data lines CD0 is connected to the common source line CN through the switches MOSFETs Q18 to Q20 of the column switch CSW0 and MOSFETs Q14 to Q16 of the N type sense amplifier SAN0. In the same way, the inversion signal line $\overline{CD0}$ is connected to the common source line CN through the switches MOSFETs Q19 to Q21 of column switch CSW0 and MOSFETs Q15 to Q17 of the N type sense amplifier SAN0. The common source line CN is coupled with the ground potential of the circuit via the drive MOSFET Q11. When the dynamic RAM is in the multibit test mode, MOSFETs Q18~Q21 of the column switch CSW0 are set simultaneously to ON, the MOSFETs Q14·Q15 to Q16·Q17 of the N type sense amplifier SAN0 are complementarily set to ON depending on the logical level of the read signal of the corresponding complementary data lines D00·$\overline{D00}$~Dm0·$\overline{Dm0}$.

The noninversion signal line CD0 of the complementary common data lines CD0 is further connected to the noninversion input terminal + of the read amplifier RA0 of main amplifier MA0 through the main amplifier switching circuit MSW0 not illustrated. In addition, the noninversion signal line CD0 is also coupled with the power source voltage of the circuit through the MOSFET Q22 of the bias circuit BC0 of column switch CSW0 and is then coupled with the ground potential of the circuit through MOSFET Q26. In the same way, the inversion signal line $\overline{CD0}$ is connected with the noninversion input terminal + of the read amplifier RA1 of main amplifier MA0 through the main amplifier switching circuit MSW not illustrated. Moreover, this inversion signal line is also coupled with the power source voltage of the circuit through MOSFET Q24 of the bias circuit BC0 and with the ground potential of the circuit through MOSFET Q28 thereof.

To the inversion input terminals of the read amplifiers RA0 and RA1, the predetermined reference voltage Vr is supplied in common from the regulated voltage generating circuit VRG of the main amplifier switching circuit MSW0. The regulated voltage generating circuit VRG includes MOSFETs Q30 and Q31 provided in series between the power supply voltage and ground potential of the circuit and four MOSFETs Q32~Q35 provided in series between the source, drain connected in common and common source line CN of these MOSFETs. Here, MOSFET Q30 is designed so as to have the electrical characteristics same as that of MOSFETs Q22 and Q24 of bias circuit BC0, as explained previously, while MOSFET Q31, to have the characteristics same as that of MOSFETs Q26 and Q28. Moreover, MOSFETs Q32 and Q33 are designed so as to have the electrical characteristics same as that of MOSFETs Q18~Q21 of column switch CSW0 and MOSFETs Q34, Q35 are designed to have the electrical characteristics same as that of MOSFETs Q14~17 of the N type sense amplifier SAN0.

From these facts, the noninversion signal line CD0 and inversion signal line $\overline{CD0}$ precharged through MOSFETs Q22 and Q24 of bias circuit BC0 when the dynamic RAM is not selected and set to the predetermined precharge level which is obtained by subtracting the threshold voltage of MOSFET Q22 or Q24 from the power source voltage of the circuit.

Figure 4A:
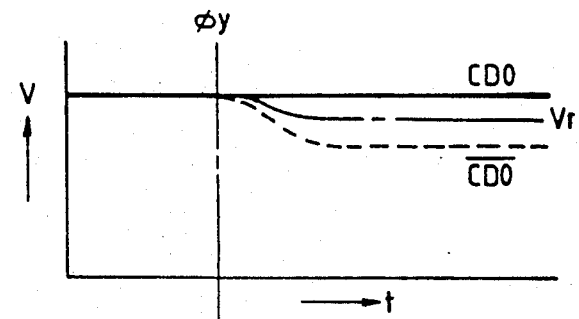
FIG. 4 indicates signal waveforms in an embodiment of the readout circuit shown in FIG. 3.
Figure 4B:
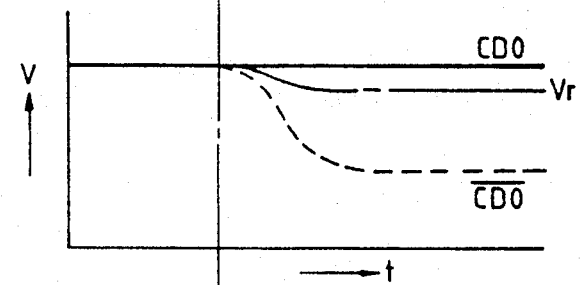
Figure 4C:
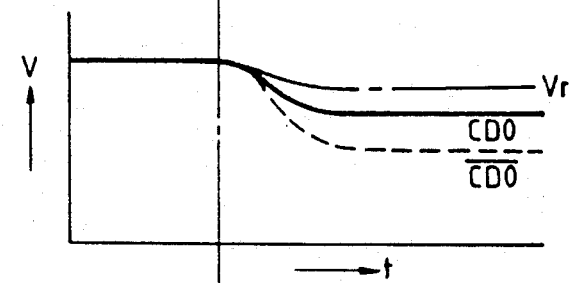
Figure 4D:
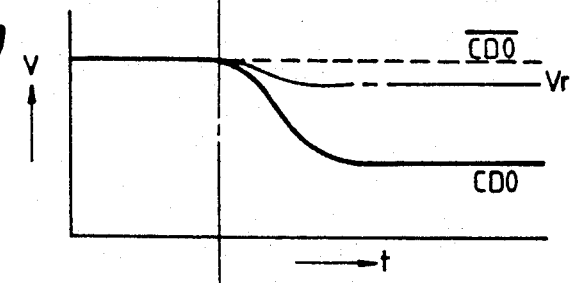
Figure 4E:
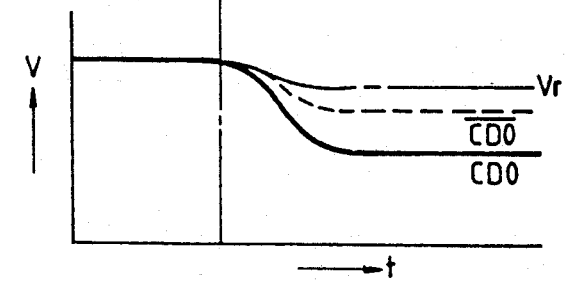

When the dynamic RAM is selected in the ordinary read mode, the timing signal 0 y is set to a high level and the one of the corresponding data line selection signals Y00~Y0n−1 to Ym0~Ymn−1 is set to a high level, the one of the switches MOSFETs Q18·Q19~Q20·Q21 of column switch CSW0 is turned ON. In this timing, when the memory cells coupled with the selected complementary data lines output the read signal "1", the corresponding MOSFETs Q15 to Q17 of the N type sense amplifier SAN0 are selectively turned ON. Therefore, the inversion signal line $\overline{DC0}$ of the complementary common data line CD0 is discharged through a corresponding pair of MOSFETs Q19 and Q15 to Q21 and Q17. As a result, as shown in FIG. 4(a), the inversion signal line $\overline{CD0}$ is set to a low level determined by the ratio of a combined conductance of a corresponding pair of MOSFETs Q19 Q15 to Q21 Q17 and a conductance of MOSFET Q24 of the bias circuit BC0. The noninversion signal line CD0 holds such precharge level.

Here, MOSFETs Q30, Q31 of the regulated voltage generating circuit VRG are designed so as to have the electrical characteristics same as that of MOSFETs Q24, Q28 of the bias circuit BC0, while MOSFETs Q32, Q33, and Q34, Q35 are designed so as to have the electrical characteristics same as that of MOSFETs Q19, Q21 and Q15, Q17. Therefore, the source and drain connected in common of the MOSFETs Q30, Q31 are substantially connected to the common source line CN through a combined conductance of MOSFETs Q32~Q35, namely a conductance corresponding to a half of the conductance of MOSFETs Q19 to Q21 and MOSFETs Q15 to Q17 forming the discharge path of the inversion signal line CD0. As a result, the reference voltage Vr is set, as shown in FIG. 4(a), to almost an intermediate level between the precharge level of the noninversion signal line CD0 and a low level after discharge of the inversion signal line $\overline{CD0}$ of the complementary common data lines CD0, namely, to almost the intermediate level of a high level and a low level of the read signal output to the complementary common data lines CD0 in the ordinary read mode.

When the dynamic RAM is selected in the multibit test mode and the m+1 pairs of complementary data lines D00·$\overline{D00}$~Dm0·$\overline{Dm0}$ of the memory array MARY0 are connected to the complementary common data lines CD0, either one of the noninversion signal line CD0 and inversion signal line $\overline{CD0}$ is selectively discharged in accordance with the read signal of these complementary data lines. Namely, in case the read signals of the complementary data lines D00·D00~ Dm0·Dm0, for example, are all logic "1", the inversion signal line $\overline{CD0}$ is discharged as shown in FIG. 4 (b), through the (m+1) pairs of MOSFETs Q19 and Q15 to Q21 and Q17 and is set to a level as low as corresponding to a combined conductance of these MOSFETs. In this case, the noninversion signal line CD0 holds such precharge level. As a result, the output signal ao of the read amplifier RA0 is set to a logic high level and an output signal ao of the read amplifier RA1 is set to a logic low level. Therefore, an output signal of the exclusive OR circuit EO1, namely the test output signal to0 is set to a high level.

In this case, if any failure occurs in the memory cell connected to any of the complementary data lines D00·$\overline{D00}$~Dm0·$\overline{Dm0}$ and its read signal becomes logic "0", the inversion signal line $\overline{CD0}$ is discharged, as shown in FIG. 4 (c), through m MOSFETs among MOSFETs Q19 and Q15 to Q21 and Q17 and the noninversion signal line CD0 is discharged through any of MOSFETs Q18 and Q14 to Q20 and Q16. Therefore, the inversion signal line $\overline{CD0}$ is set to a low level which is rather higher than that in the normal operation and noninversion signal line CD0 is set to a low level as in the case of the ordinary read mode. As a result, the output signals ao of read amplifiers RA0 and RA1 are set to a logical low level and an output signal of the exclusive OR circuit EO1, namely the test output signal to0 is set to a low level.

Meanwhile, when the dynamic RAM is selected in the multibit test mode and the (m+1) pairs of complementary data lines D00·$\overline{D00}$~Dm0·$\overline{Dm0}$ of memory array MARY0 are connected to the complementary common data lines CD0, for instance, when the read signals of these complementary data lines are all logic "0" the noninversion signal line CD0 is discharged, as shown in FIG. 4 (d), through the (m+1) pairs of MOSFETs Q18, Q14 to Q20, Q16 and is set to a level as comparatively low as corresponding to a combined conductance of these MOSFETs. In this case, the inversion signal line $\overline{CD0}$ holds such precharge level. As a result, an output signal ao of the read amplifier RA0 is set to a logical low level and an output signal ao of the read amplifier RA1 is set to a logical high level. Accordingly, an output signal of the exclusive OR circuit EO1, namely the test output signal to0 is set to a high level.

Here, if a failure occurs in the memory cells connected to any of the complementary data lines D00·$\overline{D00}$~Dm0·$\overline{Dm0}$ and read signal becomes logic "1", noninversion signal line CD0 is discharged, as shown in FIG. 4 (e), through m MOSFETs of MOSFETs Q18, Q14 to Q20, Q16 and the inversion signal line $\overline{CD0}$ is discharged through any of MOSFETs Q19, Q15 to Q21, Q17. Therefore, the noninversion signal line CD0 is set to a low level which is rather higher than that in the normal operation and the inversion signal line $\overline{CD0}$ is set to a low level as in the case of the ordinary read mode. As a result, the output signals ao of read amplifiers RA0 and RA1 are set to a logical low level and an output signal of the exclusive OR circuit EO1, namely the test output signal to0 is set to a low level.

The test signal to0 of main amplifier MA0 is supplied, as explained previously, to the test logic circuit TL with the test output signals to1~to3 of the other main amplifiers MA1~MA3 and thereby an error detection signal te is selectively formed. Thereby, the dynamic RAM of this embodiment may be considered to be capable of conducting multibit function test for total of 4×(m+1) memory cells to be selected simultaneously.

As described, the dynamic RAM of this embodiment further has four memory arrays MARY0~MARY3 and include total of eight pairs of complementary common data lines CD0·CD1 to CD6·CD7 with each two pairs of complementary data lines corresponding to each memory array. Each pair of complementary data lines is selectively connected, through the corresponding main amplifier switching circuits MSW0~MSW3, to the write amplifiers WA0, WA1 and read amplifiers RA0, RA1 of the corresponding main amplifiers MA0~MA3. When the dynamic RAM is in the multibit test mode, m+1 pairs of complementary data lines are simultaneously selected for the complementary common data lines CD0~CD7. In this case, the complementary common data lines CD0·CD1 to CD6·CD7 forming pairs are connected to the selectively corresponding main amplifiers MA0~MA3. Accordingly, the noninversion input terminal + of the read amplifiers RA0 and RA1 of each main amplifier are connected with the noninversion signal line and inversion signal line of the selected complementary common data lines, while the inversion input terminal − is supplied in common with the predetermined reference voltage Vr. The read amplifiers RA0 and RA1 of each main amplifier compare the levels of the noninversion signal line and inversion signal line of the selected complementary common data line with the reference voltage Vr and selectively set the output signals ao to a high level. The output signals ao of the read amplifiers RA0 and RA1 are supplied to the exclusive OR circuit EO1 and an output signal thereof, namely the test output signals to0~to3 are further supplied to the test logic circuit TL. As a result, an output signal of the test logic circuit TL, namely the error detection signal te is selectively set to a high level under the condition that the output signals ao of the read amplifiers RA0 and RA1 of any main amplifier are set to a high or low level, and simultaneously it is displayed that failure occurs in any of 4×(m+1) memory cells selected. Therefore, the dynamic RAM of this embodiment can increase the number of bits of multibit test function up to 4×(m+1) bits without losing high integration density. Thereby, test cost of a large capacity dynamic RAM can be curtailed and low cost characteristic can be promoted.

As explained in this embodiment, the present invention provides following effect through application into a semiconductor memory device such as a large capacity dynamic RAM having the multibit test function. Namely, (1) It can be easily identified, in the multibit test mode of the dynamic RAM, etc., that the read signals of a plurality of complementary data lines connected are in the same logical levels, by deciding that any of the noninversion signal line or inversion signal line is higher than the reference voltage, in other words, any of the noninversion signal line or inversion signal line is kept at the predetermined precharge level by simultaneously connecting a plurality of (m+1) pairs of complementary data lines for the complementary common data lines and then comparing the levels of the noninversion signal line and inversion signal line of complementary common data line with the predetermined reference voltage;

(2) The number of bits of multibit test mode can be increased, owing to the item (1), without expanding complementary common data lines and main amplifiers, namely without losing high integration density of dynamic RAM;

(3) The number of bits of multibit test mode of dynamic RAM can be increased further up to p×(m+1) bits by providing a plurality (p) of memory arrays having the corresponding complementary common data lines to the dynamic RAM in item (1);

(4) A high integration density of dynamic RAM can further be increased by providing, in the item (3), two pairs of complementary common data lines and two read amplifiers corresponding to each memory array and using such read amplifiers as the differential amplifier circuits for deciding levels of the noninversion signal line and inversion signal line of any of the corresponding complementary common data lines when the dynamic RAM is operated in the multibit test mode;

(5) From items (1)~(4), test cost of the dynamic RAM can be curtailed, leading to realization of low cost.

While the present invention has been described with reference to a preferred embodiment thereof, it will be understood by those skilled in the art that the present invention is not limited thereto in any way but covers other changes in form and details to be made therein without departing from the spirit and scope of the invention. For instance, in FIG. 1, the memory arrays MARY0~MARY3 are not particularly required to include a plurality of submemory arrays and the P type sense amplifiers SAP0~SAP3 and N type sense amplifiers SAN0~SAN3 may be arranged only to the one side of the corresponding memory arrays. The complementary common data lines may also be provided pair by pair for each of the memory arrays MARY0~MARY3. Each switch MOSFET forming the column switches CSW0~CSW3 may also be replaced respectively with a transmission gate consisting of a pair of P channel MOSFET and N channel MOSFET. In this case, the MOSFETs Q32 and Q33 provided in the regulated voltage generating circuit VRG of the main amplifier switching circuits MSW0~MSW3 shown in FIG. 2 are also required to be replaced with similar transmission gate. In FIG. 2, a conductance of transmission gates TG1~TG12 forming the main amplifier switching circuits MSW0~MSW3 is not negligible, it is enough, for example, to provide a transmission gate having the electrical characteristics same as that of the transmission gates TG9~TG12 between the transmission gates TG6 and TG3 and the regulated voltage generating circuit VRG. In case ordinary read amplifiers for only read operation and differential amplifier circuits for only the multibit test mode can be provided, corresponding to each complementary common data lines, in the main amplifiers MA0~MA3, it is no longer necessary to provide the main amplifier switching circuits MSW0~MSW3. The exclusive OR circuit EO1 may be provided together with the test logic circuit TL. Moreover, an output of the dynamic RAM in the multibit test mode may be set to a high level when the test result is normal, or to a low level when the result is unusual.

Figure 7:
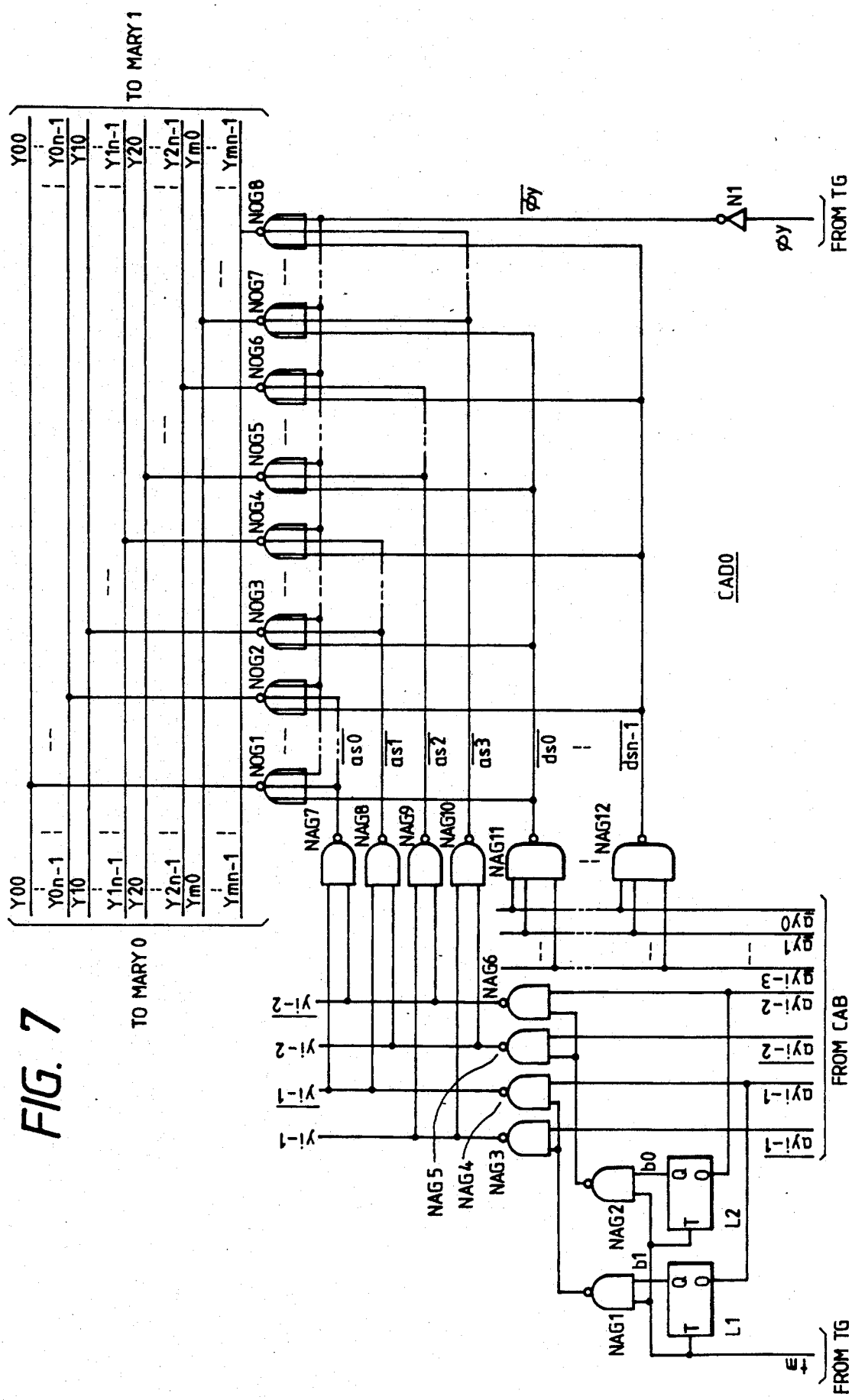
FIG. 7 is a circuit diagram showing another embodiment of a column address decoder.

In FIG. 5, the number of bits to be tested simultaneously is fixed in the multibit test mode and it can also be varied. FIG. 7 shows an embodiment of the column address decoder CAD0 in which the number of bits to be tested simultaneously may be varied. The codes given to the logic symbols shown in FIG. 7 partly match the codes given to the logic symbols shown in FIG. 5 but these do not always indicate the same logic symbols.

The column address decoder CAD0 shown in FIG. 7 includes n NAND gate circuits MAG12~MAG12 which receive the complementary internal address signals ay0 ayi−3 of lower digits through the corresponding combination and four NAND gate circuits NAG~-NAG6 which receive, at the one input terminals, noninversion or inversion internal address signals ayi−1 or $\overline{ayi-1}$ and ayi−2 or $\overline{ayi-2}$, respectively.

The output signals of NAND gate circuits NAG11-~NAG12 are selectively set to a low level when the noninversion or inversion internal address signals ayi−1 or $\overline{ayi-1}$ and ayi−b 2 or $\overline{ayi-2}$ are set to a high level through a corresponding combination. These output signals are respectively supplied in common to the second input terminals of the corresponding NOR gate circuits NOG1~NOG2 to NOG7~NOG8, as the inversion internal selection signals ds0~$\overline{dsn-1}$ to designate only one complementary data lines of each sub-memory arrays SM0~SM3.

The column address decoders CAD0 and CAD1 further include two latches L1 and L2 and NAND gate circuits NAG1 and NAG2. To the data input terminals D of the latches L1 and L2, the noninversion internal address signals ayi−1 and ayi−2 are respectively supplied and to the trigger input terminal T, the internal control signal tm is supplied in common. The noninversion output signals Q of the latches L1 and L2 are respectively supplied to the one input terminals of the NAND gate circuits NAG1 and NAG2. To the other input terminals of the NAND gate circuits NAG1 and NAG2, the internal control signal tm is supplied in common. An output signal of the NAND gate circuit NAG1 is supplied in common to the other input terminals of the NAND gate circuits NAG3 and NAG4, while an output signal of the NAND gate circuit NAG2 is supplied in common to the other input terminals of the NAND gate circuits NAG5 and NAG6. The output signals of the NAND gate circuits NAG3~NAG6 are supplied to the input terminals of the NAND gate circuits NAG7~NAG10 through the predetermined combination, as the noninversion or inversion internal address signals yi−1 or $\overline{yi-1}$ and yi−2 or $\overline{yi-2}$.

As explained heretofore, the dynamic RAM is set to the multibit test mode when the write enable signal $\overline{WE}$ and column address strobe signal $\overline{CAS}$ are set to the so-called WCBR mode where these are set to a low level prior to the row address strobe signal $\overline{RAS}$. In this WCBR mode, the number of bits designation codes b1 and b0 are respectively supplied to the external terminals Ai−1 and Ai−2. These number of bits designation codes are fetched and held by the corresponding latches L1 and L2 at the rising edge of the internal control signal tm. Thereafter, the dynamic RAM is set to the multibit test mode until the next ordinary $\overline{CAS}$ before $\overline{RAS}$ mode is executed and the read or write mode to be executed during such period is executed for the designated number of memory cells. As will be described later, in such read or write mode, the ordinary column address signal is supplied to the external terminals Ai−1 and Ai−2 and the selection pattern of memory cell is designated in accordance with these column address signals and number of bits designation codes b0, b1.

The outputs of the NAND gate circuits NAG1 and NAG2 are selectively set to a low level when the internal control signal tm is set to a high level and corresponding number of bits designation codes b1 and b0 are logic "1". When the internal control signal tm is set to a low level or when the internal control signal tm is set to a high level and the corresponding number of bits designation codes b1 and b0 are logic "0", the output signals of NAND gate circuits NAG1 and NAG2, are respectively set to a high level.

An output signal of NAND gate circuit NAG3, namely noninversion internal address signal yi−1 is selectively set to a high level when either one of the output signal of NAND gate circuit NAG1 or inversion internal address signal $\overline{ayi-1}$ is set to a low level, in other words, when the dynamic RAM is set to the multibit test mode and the number of bits designation code b1 is logic "1", or when the complementary internal address signals ayi−1 is logic "1". Moreover, an output signal of NAND gate circuit NAG4, namely the inversion internal address signal $\overline{yi-1}$ is selectively set to a high level when either one of the output signal of NAND gate circuit NAG1 or noninversion internal address signal ayi−1 is set to a low level, in other words, the dynamic RAM is set to the multibit test mode and the number of bits designation code b1 is logic "1", or when the complementary internal address signals ayi−1 is logic "0". That is, the inversion internal address signal $\overline{yi-1}$ and noninversion internal address signal yi−1 are usually created in accordance with the corresponding complementary internal address signals ayi−1 and are fixed to a high level when the dynamic RAM is set to the multibit test mode and the number of bits designation code b1 is logic "1".

In the same way, an output signal of NAND gate circuit NAG5, namely noninversion internal address signal yi−2 is selectively set to a high level when either one of an output signal of NAND gate circuit NAG2 or inversion internal address signal $\overline{ayi-2}$ is set to a low level, in other words, the dynamic RAM is set to the multibit test mode and the number of bits designation code b0 is logic "1", or when the complementary internal address signals ayi−2 are logic "1". Moreover an output signal of NAND gate circuit NAG6, namely the inversion internal address signal $\overline{yi-2}$ is selectively set to a high level when either one of an output of the NAND gate circuit NAG2 or noninversion internal address signal ayi−2 is set to a low level, in other words the dynamic RAM is set to the multibit test mode and the number of bits designation code b0 is logic "1", or when the complementary internal address signals ayi−2 are logic "0". That is, the inversion internal address signal yi−2 and noninversion internal address signal yi−2 are usually created in accordance with the corresponding complementary internal address signals ayi−2 and these are fixed to a high level when the dynamic RAM is set to the multibit test mode and the number of bits designation code b0 is logic "1".

The outputs of NAND gate circuits NAG7∼NAG10 are supplied in common, as the inversion internal selection signals $\overline{as0}\sim\overline{as3}$, to the first input terminals of the corresponding NOR gate circuits NOG1∼NOG2 to NOG7∼NOG8 to designate the submemory arrays SM0∼SM3 of the corresponding memory arrays. These inversion internal selection signals are selectively set to a high level H or a low level, L, as shown in the Table 1, in accordance with the number of bits designation codes b0 and b1 and noninversion or inversion internal address signals yi−1, $\overline{yi-1}$ or yi−2, $\overline{yi-2}$.

TABLE 1

| b1 | b0 | ay i-1 | ay i-2 | as 0 | as 1 | as 2 | as 3 |
|----|----|--------|--------|------|------|------|------|
| 0  | 0  | 0      | 0      | L    | H    | H    | H    |
|    |    | 0      | 1      | H    | L    | H    | H    |
|    |    | 1      | 0      | H    | H    | L    | H    |
|    |    | 1      | 1      | H    | H    | H    | L    |
| 0  | 1  | 0      | Δ      | L    | L    | H    | H    |
|    |    | 1      | Δ      | H    | H    | L    | L    |
| 1  | 0  | Δ      | 0      | L    | H    | L    | H    |
|    |    | Δ      | 1      | H    | L    | H    | L    |
| 1  | 1  | Δ      | Δ      | L    | L    | L    | L    |

As a result, in the one to four submemory arrays, in which the corresponding inversion internal selection signals $\overline{as0}\sim\overline{as3}$ of each memory array are set to a low level, only one memory cell designated by the complementary internal address signals ax0∼axi−3 is selected. Thereby, the dynamic RAM of this embodiment is capable of designating the number of memory cells which are simultaneously selected in the multibit test mode with the number of bits designation codes b0 and b1 and also selecting the test pattern thereof.

To the third input terminals of the NOR gate circuits NOG1∼NOG2 to NOG7∼NOG8, the signal inverted by inverter circuit N1 of the timing signal 0 y, namely the inversion timing signal 0 y is supplied in common. The output signals of these NOR gate circuits are respectively supplied, as the data line selection signals Y00∼Y0n−1 to Y30∼Y3n−1, to the corresponding submemory arrays SM0∼SM3 of the corresponding memory arrays MARY0, MARY1 or MARY2, MARY3. Thereby, the data line selection signals Y00-∼Y0n−1 to Ym0∼Ymn−1 are selectively set to a high level under the condition that the corresponding inversion internal selection signals $\overline{as0}\sim\overline{as3}$ and $\overline{ds0}\sim\overline{dsn-1}$ are set to a low level and inversion timing signal φy is set to a low level.

Namely, when the dynamic RAM is selected in the ordinary operation mode, or when the dynamic RAM is set to the multibit test mode and the number of bits designation codes b1 and b0 are logic "0", the one of inversion internal selection signal $\overline{as0}\sim\overline{as3}$ is selected, as shown in Table 1, to a low level in accordance with the complementary internal address signals ayi−1 and ayi−2. In this case, the one of inversion internal selection signals $\overline{ds0}\sim\overline{dsn-1}$ is set to a low level in accordance with the complementary internal address signals ay0∼ayi−3. Accordingly, the one of data line selection signals Y00∼Y0n−1 to Ym0∼Ymn−1 is set to a high level when the timing signal 0 y is set to a high level and the inversion timing signal 0 y to a low level. As a result, the corresponding two pairs of complementary data lines are selected respectively from the memory arrays MARY0∼MARY3 and connected respectively to the corresponding complementary common data lines CD0·CD1 to CD6·CD7.

Meanwhile, when the dynamic RAM is set to the multibit test mode and the number of bits designation codes b1 and b0 are in a combination of logic "0 1", the inversion internal selection signals $\overline{as0}\sim\overline{as3}$ are set to a low level, in unit of two lines, as shown in Table 1, in accordance with the complementary internal address signals ayi−1. In this case, the one of inversion internal selection signals $\overline{ds0}\sim\overline{dsn-1}$ is set to a low level in accordance with the complementary internal address signals ay0∼ayi−3. Accordingly, the corresponding bits of the data line selection signals Y00∼Y0n−1, Y10∼Y1n−1 or Y2∼Y2n−1 and Y30∼Y3n−1 are set to a high level simultaneously in synchronization with the timing signal 0 y. As a result, the corresponding complementary data lines are selected simultaneously from the submemory arrays SM0, SM1 or SM2, SM3 of the memory arrays MARY0∼MARY3 and are respectively connected to the corresponding complementary common data lines CD0·CD1 to CD6·CD7. Thereby, the dynamic RAM simultaneously selects eight memory cells in total from the memory arrays, two memory cells disposed in each adjacent submemory array of each memory array and conducts multibit test for these memory cells.

In the same way, when the dynamic RAM is set to the multibit test mode and the number of bits designation codes b1 and b0 are given in a combination of the logic "1 0", the inversion internal selection signals $\overline{as0}$-∼$\overline{as3}$ are set, as shown in Table 1, simultaneously to a low level in unit of two lines in accordance with the complementary internal address signals ayi−2. In this case, the one of inversion internal selection signals $\overline{ds0} \sim \overline{dsn-1}$ is set to a low level in accordance with the complementary internal address signals ay0~ayi−3. Accordingly, the corresponding bits of the data line selection signals Y00~Y0n−1 and Y20~Y2n−1 or Y10~Y1n−1 and Ym0~Ymn−1 are simultaneously set to a high level in synchronization with the timing signal 0 y. As a result, the corresponding data lines are simultaneously selected from the submemory arrays SM0 and SM2 or SM1 and SM3 of the memory arrays MARY0~MARY3 and respectively connected to the corresponding complementary common data lines CD0·CD1 to CD6·CD7. Thereby, the dynamic RAM simultaneously selects eight memory cells in total from the memory arrays, two memory cells disposed in every other submemory of each memory array and conducts the multibit test for these memory cells.

Moreover, when the dynamic RAM is set to the multibit test mode and the number of bits designation codes b1 and b0 are logic "1", the inversion internal selection signals $\overline{as0} \sim \overline{as3}$ are all set to a low level at a time, as shown in Table 1, without relation to the complementary internal address signals ayi−1 and ayi−2. Here, the one of inversion internal selection signals $\overline{ds0} \sim \overline{dsn-1}$ are also set to a low level in accordance with the complementary internal address signals ay0-~ayi−3. Accordingly, the corresponding bits of data line selection signals Y00~Y0n−1 to Ym0~Ymn−1 are simultaneously set to a high level in synchronization with the timing signal 0 y. As a result, the corresponding four pairs of complementary data lines are simultaneously selected from the submemory arrays SM0 to SM3 of memory arrays MARY0~MARY3 and are respectively connected to the corresponding complementary common data lines CD0·CD1 to CD6·CD7. Thereby, the dynamic RAM selects simultaneously 16 memory cells in total from the memory arrays, four memory cells disposed in the corresponding addresses of the submemory arrays SM0~SM3 of each memory array and conducts the multibit test for these memory cells.

According to the embodiment shown in FIG. 7, following effects can be obtained. Namely, (1) The number of memory cells to be tested simultaneously can be optimized depending on the test contents by selectively changing, in the multibit test mode of dynamic RAM, the number of memory cells to be tested simultaneously in accordance with a the number of bits designation codes supplied from the predetermined external terminals;

(2) A test pattern can be changed, in the item (1) by changing a combination of the memory cells to be tested simultaneously, namely the submemory arrays.

(3) According to items (1) and (2), the test cost in the test mode of the large capacity dynamic RAM can be curtailed while enhancing the test accuracy.

In FIG. 6, the dynamic RAM is allowed to receive the X address signals AX0~AXi and Y address signals AY0~AYi with individual input terminals. Moreover, the refresh control signal $\overline{RF}$ and test mode signal $\overline{TM}$ may be replaced, for example, with the predetermined combination of the row address strobe signal $\overline{RAS}$, column address strobe signal $\overline{CAS}$ and write enable signal $\overline{WE}$. The dynamic RAM is also allowed to provide a plurality of memory mats basically constituted by the memory arrays MARY0~MARY3. In addition, the embodiment of the present invention covers a variety of changes or modifications in the memory arrays shown in FIG. 1 and the peripheral circuits thereof, the main amplifier switching circuits and main amplifiers shown in FIG. 2, practical circuit constitution of column address decoders shown in FIG. 5, block constitution of dynamic RAM shown in FIG. 6 and combination of address signals and control signals, etc.

In above explanation, the present invention which is made by the inventors of the present invention is applied to a dynamic RAM which is the application field as the background of the present invention, but the present invention is not limited only to such dynamic RAM. For example, the present invention can also be applied to a multiport RAM employing the dynamic memory cells as the basic constitution and other kinds of semiconductor memory devices. The present invention can be applied at least to a semiconductor memory device having the multibit test function and a digital apparatus including such semiconductor memory devices.

This invention is not limited to the above preferred embodiment. For instance, in FIG. 3, the noninversion input terminal +of the read amplifiers RAO (RA1) may be connected with the noninversion signal line CDO and inversion input terminal −of the read amplifier RA1 (RA0) may be connected with the inversion signal line $\overline{CDO}$, while the inversion input terminal −of the read amplifier RA0 (RA1) and the noninversion input terminal +of the read amplifier RA1 (RA0) are supplied in common with the predetermined reference voltage Vr.

What is claimed is:

1. A semiconductor memory device comprising:
  a plurality of data lines, each of which is coupled to a memory cell;
  a plurality of switch means each of which is coupled at one end with a respective line of the plurality of data lines and with a common data line at the other end thereof;
  a control means for turning ON one or a plurality of said switch means, wherein said control means turns ON one switch means in an ordinary read mode and turns ON a plurality of switch means in a test mode;
  a differential amplifier circuit in which one input terminal thereof is coupled with said common data line; and
  a reference voltage generating means for supplying a reference voltage to the other input terminal of said differential amplifier circuit.

2. The semiconductor memory device according to claim 1, wherein said reference voltage is set, in the ordinary read mode, to an intermediate level voltage between the high and low level voltages of thereof read signal transmitted to said common data lines.

3. The semiconductor memory device according to claim 2, wherein said memory cell is a dynamic memory cell and said test mode is a multibit test mode which is simultaneously conducted upon a plurality of memory cells selected simultaneously.

4. The semiconductor memory device according to claim 3, wherein said control means has a function to change the number of said plurality of switch means to be set to ON.

5. The semiconductor memory device according to claim 4, wherein the number of memory cells to be tested simultaneously can be selectively changed depending on the number of bits in predetermined designation codes supplied through predetermined external terminals.

6. A semiconductor memory device comprising:
a plurality of data line pairs;
memory cells provided corresponding to each data line pair;
common data line pairs connected in common to said plurality of data line pairs;
switch means respectively coupled between said plurality of data line pairs and said common data line pairs;
control means for turning ON one or a plurality of the switch means among said plurality of switch means, wherein said control means turns ON one switch means in an ordinary read mode and turns ON a plurality of switch means in a test mode;
a first differential amplifier circuit in which a first input terminal thereof is connected to a first common data line of said common data line pairs and a second input terminal thereof to a second common data line of said common data line pairs;
a reference voltage generating means for supplying a reference voltage to said first input terminal; and
a first switch means for selectively supplying the signal of said first common data line or said reference voltage to said first input terminal, wherein the signal of said first common data line is supplied to the first input terminal in the ordinary read mode and said reference voltage is supplied to said first input terminal in the test mode.

7. The semiconductor memory device according to claim 6, further comprising a second differential amplifier circuit in which the first input terminal thereof receives said reference voltage and the second input terminal thereof receives, the signal of said second common data line in said test mode.

8. The semiconductor memory device according to claim 7, wherein said reference voltage is set to a substantially intermediate level voltage between a high and a low levels of a read signal to be sent to said common data line pairs in said ordinary read mode.

9. The semiconductor memory device according to claim 8, wherein said memory cell is a dynamic memory cell and said test mode is a multibit test mode to be conducted upon a plurality of memory cells selected simultaneously.

10. The semiconductor memory device according to claim 9, further comprising a logic circuit for deciding a test result in said test mode on the basis of an output signal of said first differential amplifier circuit and an output signal of said second differential amplifier circuit.

11. The semiconductor memory device according to claim 10, wherein said logic circuit includes an exclusive OR circuit which receives output signals of said first and second differential amplifier circuits with the first and second input terminals thereof.

12. The semiconductor memory device according to claim 11, said control means has a function to vary the number of switch means to be turned ON.

13. The semiconductor memory device according to claim 12, wherein the number of memory cells to be simultaneously tested can be selectively varied depending on the number of bits or predetermined designation information supplied through predetermined external terminals.

14. The semiconductor memory device according to claim 13, wherein the device is set to the multibit test mode in synchronization with the row address strobe signal being set to a low level when a write enable signal and column address signal supplied from the external terminals are set to a low level.

15. The semiconductor memory device according to claim 10, wherein said first input terminals of said first and second differential amplifier circuits are inversion input terminals and said second input terminals are non-inversion input terminals.

16. A semiconductor memory device comprising:
a first data line pair group coupled in common with a first common data line pair,
a second data line pair group coupled in common with a second common data line pair,
memory cells provided corresponding to each data line pair,
a first switch group comprised of switch means respectively coupled between each data line pair of said first data line pair group and said first common data line pair,
a second switch group comprised of switch means respectively coupled between each data line pair of said second data line pair group and said second common data line pair, and
a control means for controlling said first and second switch groups, wherein said control means turns ON, in an ordinary read mode, one switch means in said first switch group and one switch means in said second switch group, and also turns ON, in a test mode, a plurality of switch means of said first switch group and a plurality of switch means of said second switch group.

17. The semiconductor memory device according to claim 16, further comprising:
a first differential amplifier circuit in which a first input terminal thereof is coupled with a first common data line of said first common data line pair and a second input terminal thereof with a second common data line of said first common data line pair, and
a second differential amplifier circuit in which a first input terminal thereof is coupled with a first common data line of said second common data line pair and a second input terminal thereof with a second common data line of said second common data line pair.

18. The semiconductor memory device according to claim 17, further comprising:
a reference voltage generating means for supplying reference voltage to the first input terminals of said first and second differential amplifier circuits, and
a supply signal switching means provided between said first and second differential amplifier circuits, said first and second common data line pairs and said reference voltage generating means; wherein the signals of said first common data line pair are supplied to the first and second input terminals of said first differential amplifier circuit and the signals of said second common data line pair are supplied to the first and second input terminals of said second differential amplifier circuit in the ordinary read mode, and said reference voltage is respectively supplied to said first input terminals of said first and second differential amplifier circuits, said second common data lines of said first and second common data line pairs are supplied to said second input terminal of said first differential amplifier circuit and said first common data liens of said first and second common data line pairs are supplied to the second input terminal of said second differential amplifier circuit in said test mode.

19. The semiconductor memory device according to claim 18, wherein said reference voltage is set to a substantially intermediate level voltage between a high and low level voltages of a read signal sent to said common data line pairs in said ordinary read mode.

20. The semiconductor memory device according to claim 19, wherein said first input terminals of said first and second differential amplifier circuits are inversion input terminals and said second input terminals are non-inversion input terminals.

21. The semiconductor memory device according to claim 20, wherein said memory cell is a dynamic memory cell land said test mode is a multibit test mode conducted upon a plurality of memory cells to be selected simultaneously.

22. The semiconductor memory device according to claim 21, further comprising a logic circuit for deciding a test result in said test mode on the basis of an output signal of said first differential amplifier circuit and an output signal of said second differential amplifier circuit.

23. The semiconductor memory device according to claim 22, wherein said logic circuit includes an exclusive OR circuit which receives output signals of said first and second differential amplifier circuits with a first and a second input terminals.

24. The semiconductor memory device according to claim 23, wherein said control means has a function to vary the number of switch means to be turned ON.

25. The semiconductor memory device according to claim 24, wherein the number of memory cells to be simultaneously tested can be varied depending on the number of bits in predetermined designation information supplied through predetermined external terminals.

26. The semiconductor memory device according to claim 25, wherein the device is set to said multibit test mode in synchronization with a row address strobe signal being set to a low level when a write enable signal and column address signal supplied from the external terminals are set to a low level.

* * * * *